United States Patent
Elwart

(10) Patent No.: US 7,426,910 B2
(45) Date of Patent: Sep. 23, 2008

(54) ENGINE SYSTEM HAVING IMPROVED EFFICIENCY

(75) Inventor: Shane Elwart, Ypsilanti, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 11/554,395

(22) Filed: Oct. 30, 2006

(65) Prior Publication Data

US 2008/0098972 A1 May 1, 2008

(51) Int. Cl.
- F02B 71/04 (2006.01)
- F02N 17/02 (2006.01)
- B60K 1/00 (2006.01)
- H01L 35/28 (2006.01)

(52) U.S. Cl. ............ 123/46 E; 123/46 R; 123/142.5 E; 180/65.2; 180/65.3; 136/203; 136/205

(58) Field of Classification Search ................. 123/46 E, 123/46 R, 142.5 R, 142.5 E; 180/65.2, 65.3; 136/203–205

See application file for complete search history.

(56) References Cited

U.S. PATENT DOCUMENTS

| | | | |
|---|---|---|---|
| 4,489,242 A * | 12/1984 | Worst | 307/10.1 |
| 6,172,427 B1 * | 1/2001 | Shinohara et al. | 290/40 B |
| 6,605,773 B2 * | 8/2003 | Kok et al. | 136/242 |
| 6,748,907 B2 * | 6/2004 | Malmquist et al. | 123/46 E |
| 2003/0000486 A1 * | 1/2003 | Ott et al. | 123/41.31 |
| 2005/0081834 A1 | 4/2005 | Perkins | |
| 2005/0217714 A1 | 10/2005 | Nishijima et al. | |
| 2006/0000651 A1 * | 1/2006 | Stabler | 180/65.3 |
| 2006/0101822 A1 | 5/2006 | Murata | |
| 2006/0124083 A1 | 6/2006 | Niiyama et al. | |
| 2007/0017223 A1 * | 1/2007 | Wootton et al. | 60/645 |
| 2007/0126236 A1 | 6/2007 | Tamura et al. | |

FOREIGN PATENT DOCUMENTS

| | | |
|---|---|---|
| EP | 1674325 | 8/2007 |
| WO | 2005098225 | 10/2005 |

* cited by examiner

*Primary Examiner*—Stephen K. Cronin
*Assistant Examiner*—Ka Chun Leung
(74) *Attorney, Agent, or Firm*—Julia Voutyras; Alleman Hall McCoy Russell & Tuttle, LLP

(57) ABSTRACT

A propulsion system for a vehicle, comprising of an internal combustion engine, a thermoelectric device in thermal communication with the engine, and a control system for controlling the engine and the thermoelectric device during a first mode, supply electrical energy to the thermoelectric device to cause the thermoelectric device to produce at least some heat, and during a second mode, operate the engine to produce at least some heat, where the thermoelectric device is operated to convert a temperature gradient at the thermoelectric device to electrical energy.

21 Claims, 7 Drawing Sheets

ENGINE SYSTEM HAVING IMPROVED EFFICIENCY

BACKGROUND AND SUMMARY

Some automobiles utilize an internal combustion engine to provide at least a portion of the wheel power requested by the driver. As one example, a hybrid electric vehicle (HEV) can control the engine to operate under select conditions, while an electric motor can separately provide the requested propulsive effort. While some efficiency gains may be achieved by supplementing the operation of the engine with that of a motor, substantial inefficiencies may nevertheless remain. As one prophetic example, up to 75% of the fuel energy consumed by an internal combustion engine may be lost to unexploited thermal energy, under some conditions. Of this, approximately 35% may be lost to the exhaust gases of the engine, 20% to the coolant or cooling process, and another 20% to thermal radiation.

Some vehicle propulsion systems have attempted to address the above issues by reducing the amount of time that the engine is operating or by downsizing the engine by increasing use of the motor. Other approaches have sought to confront these inefficiencies directly by attempting to recapture the rejected thermal energy through the use a thermoelectric conversion device. For example, a vehicle may include one or more of these devices for converting at least a portion of the thermal energy of the exhaust gases produced by the engine to electrical energy for use by other vehicle systems.

These thermoelectric devices rely on a temperature gradient to generate electrical energy. As such, efforts have been made to subject the thermoelectric device to as great of a temperature gradient as possible. However, one issue with the thermoelectric device includes the potential for thermal damage caused by excessive temperatures. Thus, while large temperature gradients may be useful to efficiently recapture rejected thermal energy, if temperatures are too high, protection of the device from excessive temperature conditions may occur.

Various approaches have attempted to provide an acceptable yet efficient operating environment for the thermoelectric device, including the use of variable heat exchangers arranged between the heat source and the device. However, the additional hardware can increase the cost of the vehicle, reduce efficiency via increased weight or pumping losses or create additional issues, under some conditions.

Additionally, the inventors of the present disclosure have also recognized that some portions of the propulsion system such as the engine and/or catalyst may experience reduced efficiencies during cooler operating conditions, such as before or during warm-up of the engine.

In one approach, the above issues may be addressed by a propulsion system for a vehicle, comprising an internal combustion engine; a thermoelectric device in thermal communication with the engine; and a control system for controlling the engine and the thermoelectric device to during a first mode, supply electrical energy to the thermoelectric device to cause the thermoelectric device to produce at least some heat; and during a second mode, operate the engine to produce at least some heat, where the thermoelectric device is operated to convert a temperature gradient at the thermoelectric device to electrical energy.

In this way, the temperature of the engine, exhaust passage, and/or catalyst may be controlled, for example, by providing heating during lower temperature conditions, while electrical energy generation may be achieved during higher temperature conditions.

Further, the above system may be used in combination with a free-piston engine to achieve even greater efficiency gains over fixed-piston type engines having pistons mechanically coupled to a crankshaft, while an induction device can be used to convert kinetic energy of the free-piston to electrical energy that may be combined with or used separately from the energy generated by the thermoelectric device to power a drive motor.

In this way, synergy between the free-piston engine in a full series or other HEV configuration and the thermoelectric conversion system may be achieved by varying operation of the free-piston engine in response to the temperature at the thermoelectric devices. The thermoelectric devices may then be placed closer to the heat source, such as directly at or surrounding the engine where the temperature may be controlled within a more efficient temperature range while reducing high temperature conditions that may otherwise occur. Note that variable heat exchangers arranged between the heat source and the device may additionally be used, along with fixed piston engines, if desired.

DETAILED DESCRIPTION

The present disclosure relates generally to a hybrid propulsion system for a vehicle such as an automobile. The hybrid propulsion system described herein may utilize the synergy between a fuel combusting engine, a drive motor, and one or more thermoelectric devices to achieve increased efficiency, lower products of combustion, and/or improved drivability, under some conditions.

In at least one embodiment, a full series hybrid vehicle configuration may be used that enables the engine to be operated independent of the requested wheel torque. For example, by providing the desired propulsive force via a motor, the engine may be operated in response to other operating parameters. As one example, operation of the engine may be varied in response to the temperature of the thermoelectric conversion system to reduce or prevent unsuitably high temperature conditions that may cause damage or decrease the lifecycle of the thermoelectric device.

Still other synergies may be realized by utilizing a free-piston engine configuration that can be operated more efficiently and/or more quietly than an internal combustion engine having a drive shaft and fixed-pistons. The free-piston engine can be well suited in this configuration since the engine is not necessarily required to provide shaft work when used in a full series hybrid propulsion system, but may instead drive an induction machine that generates electrical energy that can be combined with or used as an alternative to the electrical energy generated by the thermoelectric devices. When the level of electrical energy provided by the thermoelectric devices and/or energy storage device are sufficient to provide the suitable power output, the engine operation may be reduce or may be shut-off.

Still other advantages may exist. As one example, when starting the vehicle in low temperature conditions, the thermoelectric device may be operated to provide heating to different areas of the engine before or during starting. Further, catalyst heating may be provided by one or more thermoelectric devices arranged in the exhaust system, thereby improving the conversion efficiency of the exhaust aftertreatment system during warm-up. Such operations may be performed when the hybrid propulsion system is coupled to an external energy source, such as during a recharging operation.

Figure 1:
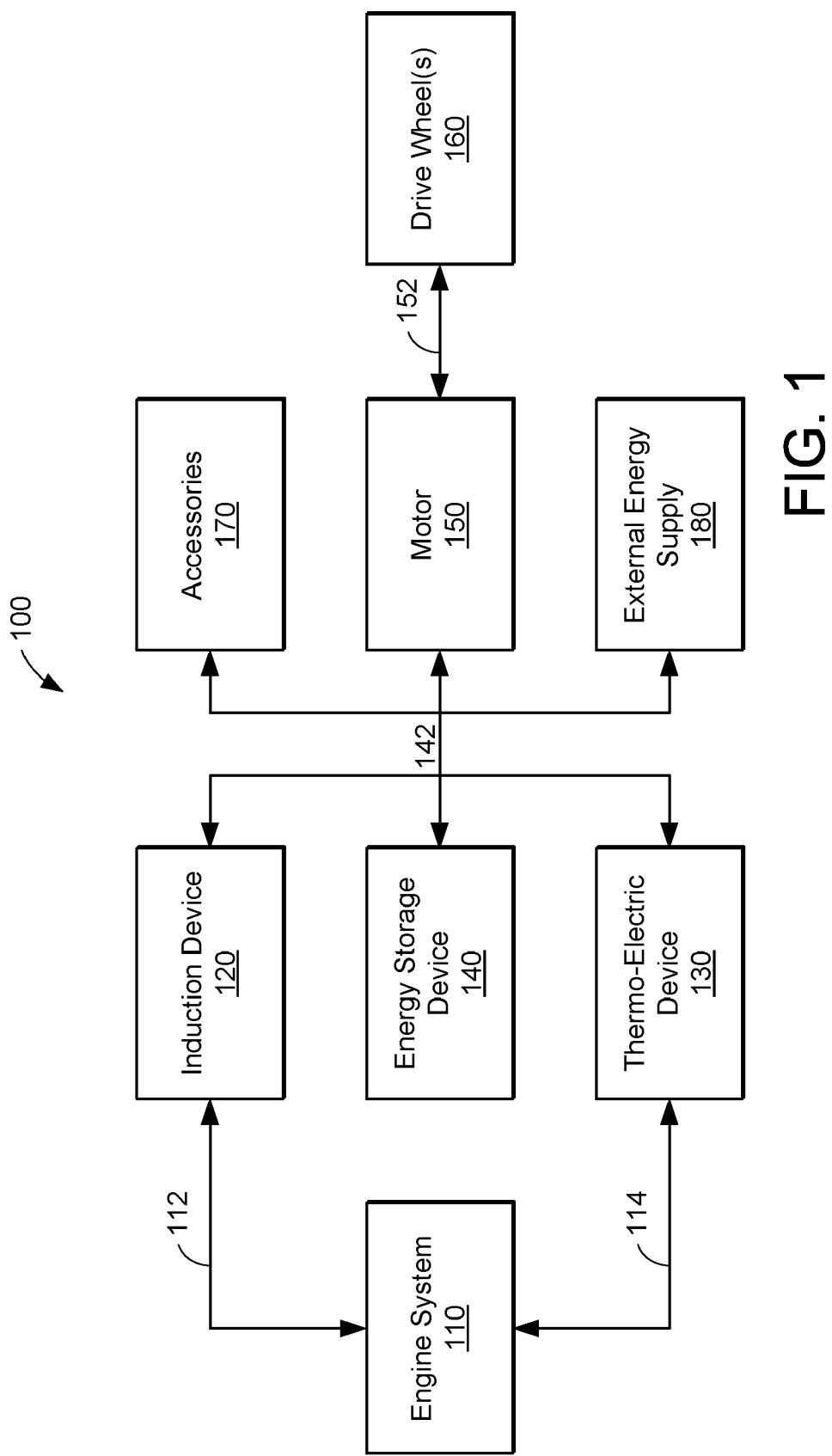
FIG. 1 illustrates an example of a hybrid propulsion system.

FIG. 1 illustrates a non-limiting example of a hybrid propulsion system 100 that may be used with a vehicle such as an automobile, for example, however, propulsion system 100 may be used in other non-vehicle applications where suitable. Propulsion system 100 may include an engine 110 including one or more combustion chambers and/or pistons. As one example, engine 110 may include what is known as a free-piston type internal combustion engine. Propulsion system 100 may include one or more induction devices 120 for converting motion of one or more pistons of engine 110 to electrical energy. Further, induction device 120, in some conditions, may receive electrical energy from an energy storage device 140 via 142 for performing an alternative operation including moving one or more pistons engine 110, such as during a start-up operation of the engine. Thus, communication of electrical energy between engine 110 and induction device 120 may be bi-directional as indicated by 112. Similarly, the direction of flow of electrical energy between induction device 120 and energy storage device 140 via 142 may be bidirectional. In this manner, energy may be stored by the energy storage device in some conditions or may be selectively supplied to the induction device in other conditions.

Propulsion system 100 may include a thermoelectric conversion system including one or more thermoelectric devices 130 for converting thermal energy of a temperature gradient created by the engine into electrical energy as indicated by 114. As one example, thermoelectric device 130 may utilize what may be referred to as the Seebeck effect, where a temperature gradient (e.g. between the engine and ambient) may be used to generate electrical energy. Alternatively, in some conditions, thermoelectric device 130 may utilize a physical property what may be referred to as the Peltier effect where electrical energy may be supplied to the thermoelectric device to create a temperature gradient across the device. This approach may be applied when utilizing the thermoelectric device to provide heating or cooling to a component of the propulsion system.

A thermoelectric device may include p-type semiconductors and n-type semiconductors which both constitute thermoelements for converting a difference in temperature between a higher temperature side and a lower temperature side of the device into electrical energy. As one example, the n-type and p-type semiconductors may be stacked alternately along a longitudinal width of the device as will be shown in greater detail with reference to FIG. 7.

In this manner, thermal gradients created by operation of engine 110 may be converted to electrical energy. As will be described in detail with reference to FIG. 2, one or more thermoelectric devices may be arranged in various locations such as near the engine, along an exhaust passage coupled to the engine, or at a radiator of the engine. In some conditions, such as during warm-up of the engine or before engine start-up, electrical energy may be supplied to the thermoelectric devices to provide heat to the engine or other vehicle systems.

Electrical energy may be supplied to thermoelectric device 130 from various sources such as energy storage device 140, induction device 120, an external energy supply 180, or motor 150 (e.g. during a regenerative braking operation). Alternatively, electrical energy may be supplied from thermoelectric device 130 to the energy storage device, induction device, one or more accessories or motor. Further, in some conditions, electrical energy may be selectively transferred between one or more systems including the induction device, the thermoelectric device, energy storage device, external energy supply, motor, and/or accessories via 142 as directed by the control system shown in FIG. 2.

Energy storage device 140 may include one or more buffers suitable for storing electrical energy and selectively supplying electrical energy to one or more components of the propulsion system. For example, energy storage 140 may include one or more batteries and/or capacitors. Energy storage device 140 can supply electrical energy to or receive electrical energy from motor 150 as indicated by 142.

Motor 150 may be any suitable device for converting electrical energy to propulsive force and/or generating electricity from the propulsive force of drive wheels 152. In some embodiments, motor 150 may include one or more separate electric motors. During some conditions, motor 150 may selectively receive electrical energy from at least one of induction device 120, energy storage device 140, and thermoelectric device 130 to provide propulsive force to one or more drive wheels 160. During other conditions, motor 150 may provide a regenerative braking operation for the vehicle by receiving kinetic energy from one or more drive wheels 160 as indicated by 152. The kinetic energy may be converted into electrical energy for use by one or more of the induction device 120, thermoelectric device 130, and accessories 170, or may stored by energy storage device 140. Thus, 142 represents the flow of electrical energy between various components of propulsion system 100.

Further, in some embodiments, propulsion system 100 may receive energy from an external energy supply 180. As one example, external energy supply 180 may include a charging station for enabling an engine pre-heating operation prior to and/or during engine start-up or for recharging the energy storage device. External energy supply 180 may be stationary or may be moveable. As one example, external energy supply 180 may be operatively connected to the propulsion system by a removable connector that transmits electrical energy to the propulsion system. For example, propulsion system 100 may be operatively coupled to external energy supply 180 via a wire or cable and while the vehicle containing the propulsion system is at rest (e.g. parked).

While not shown in FIG. 1, propulsion system 100 may include a transmission for transmitting torque produced by motor 150 to one or more of the drive wheels. Further still, propulsion system 100 may include a control system as shown in FIG. 2 for controlling the operation of each of the components described herein including the level or amount of electrical, mechanical, or thermal energy that is transferred between these components.

Figure 2:
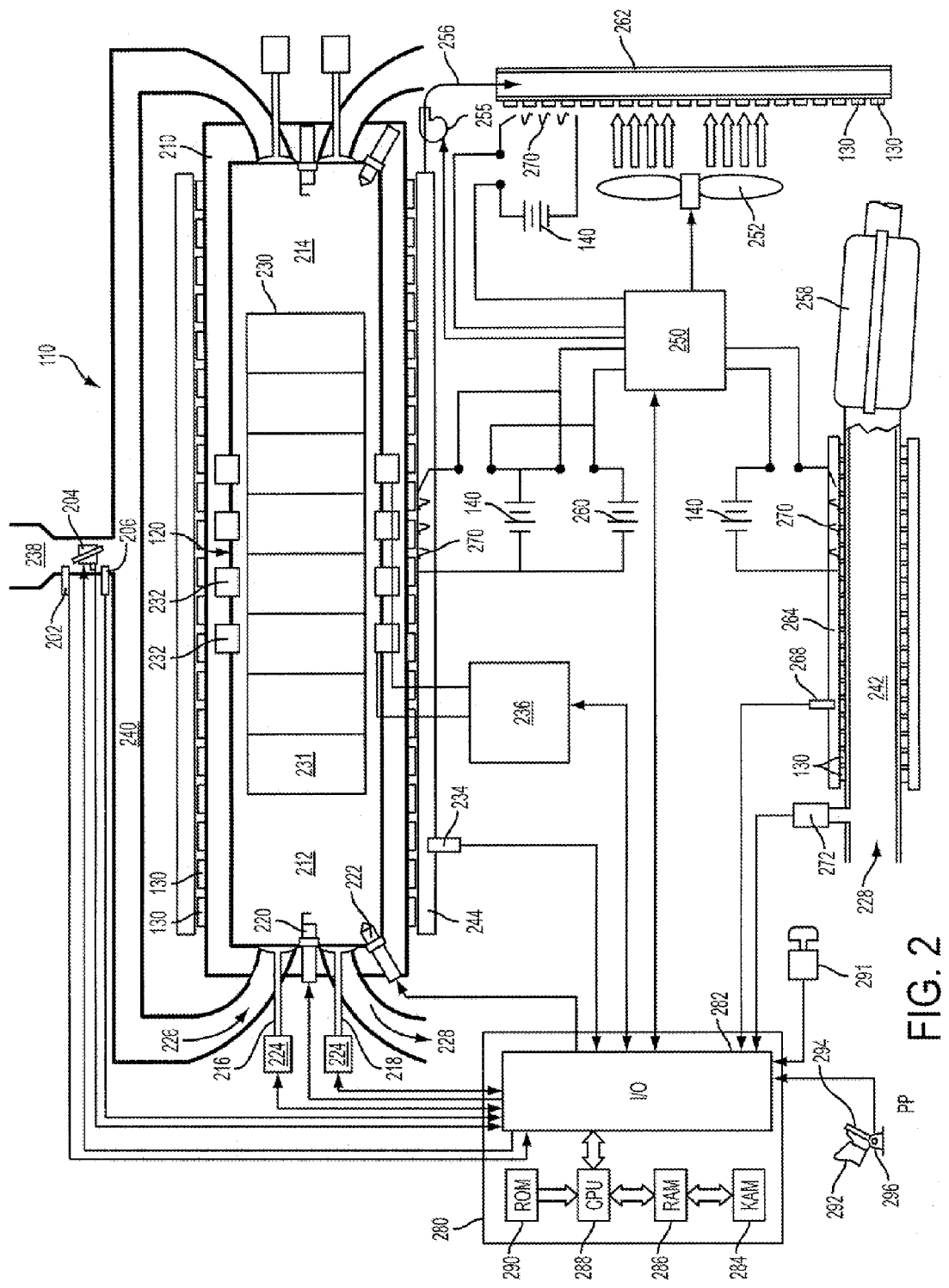
FIG. 2 illustrates an example free-piston engine including an induction machine and at least one thermoelectric device.

FIG. 2 illustrates a detailed view of an example embodiment of engine system 110 including a plurality of thermoelectric devices 130, an induction device 120, and an energy storage device 140 as described above with reference to FIG. 1. In this particular embodiment, engine system 110 comprises an internal combustion free-piston engine including two combustion chambers 212 and 214. In alternative embodiments, the engine may include more or less combustion chambers and/or free-pistons. Combustion chambers 212 and 214 are defined by a bore formed in engine block 210 and the moveable free-piston 230 such that they may expand and contract in volume as piston 230 is translated within the bore of engine block 210.

Intake air may be admitted to the combustion chambers via an intake manifold 238 by way of intake passage 240. A throttle 204 can be controlled by control system 280 to vary the amount of airflow into intake passage 240 and/or pressure of the intake passage. Further, a mass air flow sensor 202 and an intake air pressure sensor 206 may be arranged to provide an indication of the mass flow rate and pressure of the intake air to controller 280.

The flow of intake air into combustion chamber 212 as indicated by vector 226 may be controlled by at least one intake valve 216. The position of intake valve 216 may be varied via a valve actuator 224 as controlled by controller 280. In some embodiments, valve actuator 224 may be an electromechanical valve actuator or may alternatively include a camshaft and one or more cams. Similarly, at least one exhaust valve 218 may be operated to control the flow of exhaust products from combustion chamber 212 as indicated by vector 228.

The timing of the intake and/or exhaust valve opening and closing events may be controlled by the control system by varying a condition of the actuator. For example, with regards to electromechanical valve actuators, the control system may vary a level of current applied to the actuator to cause the valve to open and close. Alternatively, with regards to a cam actuated valve, variable valve timing and/or variable valve lift may be provided by a cam profile switching system and/or a variable cam timing system in response to a control signal provided by the control system.

Fuel may be supplied to combustion chamber 212 by a fuel injector 222. As shown in the embodiment of FIG. 2, the fuel injector may be arranged in the combustion chamber to provide what may be referred to as direct injection of fuel. However, in alternative embodiments, a fuel injector may be arranged in an intake passage upstream of combustion chamber 212 in what may be referred to as port injection. The amount of the fuel injection and timing of the fuel injection may be varied by controller 280 in response to various operating conditions as will be described herein.

A sparking device such as spark plug 220 may be used to provide an ignition spark to combustion chamber 212 in response to a spark advance signal from controller 280. In this manner, combustion may be initiated, at least during some conditions, by what may be referred to as spark ignition. While the embodiment shown in FIG. 2 includes a spark plug, in some conditions, combustion may be carried out by compression ignition without necessarily requiring a spark to be performed. In alternative embodiments, the engine may not include a spark plug.

An induction machine 120 as described with reference to FIG. 1 may be incorporated into the free-piston engine to generate electrical energy responsive to movement of piston 230. In this embodiment, piston 230 includes one or more permanent magnets for generating electrical current in coils 232 that line the bore of engine block 210. An induction controller 236 may be included to control the level of electrical energy generated by induction device 120 by varying a level of induction such as through an adjustment of the load and/or voltage applied across the coils. In some conditions, induction controller 236 may instead provide electrical energy to coils 232 to cause piston 230 to move in a particular direction. Such operation may be performed during an engine start-up operation. Induction controller 236 may send and receive control signals from controller 280, for example, to provide an indication of the relative position and/or speed of the piston.

Controller 280 is shown in FIG. 2 as a microcomputer, including microprocessor unit 288, input/output ports 282, an electronic storage medium for executable programs and calibration values shown as read only memory chip 290 in this particular example, random access memory 286, keep alive memory 284, and a data bus. Controller 280 may receive various signals from sensors coupled to engine system 110, in addition to those signals previously discussed, including measurement of inducted mass air flow from mass air flow sensor 202; engine coolant temperature from temperature sensor 234 coupled to cooling sleeve 244; throttle position from a throttle position sensor included in throttle 204; and absolute manifold pressure signal from sensor 206. An engine speed signal may be generated by controller 280 from signals received by induction controller 236 based on the characteristics of the current generated in coils 232. Manifold pressure signal from a manifold pressure sensor 206 may be used to provide an indication of vacuum, or pressure, in the intake manifold.

Controller 280 may receive operator input from a vehicle operator a portion of which is shown at 292. As one example, the position or movement of an accelerator pedal 294 may be detected by a pedal sensor 296. Operator input received via the accelerator pedal or other input device may be proportional to a level of torque or speed requested by the operator. Thus, the output of motor 150 described above with reference to FIG. 1, among other components of the propulsion system may be varied in response to the operator input. Controller 280 may receive other operator inputs including an ignition switch 291 via the position of a key, for example. In this manner, a user may select at least a key-on position resulting in operation state of the propulsion system and a key-off position resulting in non-operating state of the propulsion system.

Combustion chamber 214 may similarly include intake and exhaust valves, a spark plug, and a fuel injector as described above with reference to combustion chamber 212.

One or more thermoelectric devices 130 may be arranged at various locations of the propulsion system, such as between engine block 210 and cooling sleeve 244. Heat generated by the engine can flow to a heat transfer media passing through cooling sleeve 244. The heat transfer media may include any suitable media for transferring thermal energy between the thermoelectric device and the ambient air surrounding the system. As one example, the heat transfer medium may include a fluid such as engine coolant, water, air, or combinations thereof, among others. The temperature difference between the engine block and the cooling sleeve including the heat transfer media can be used by the thermoelectric devices to generate electrical current in circuit 270, as will be described with reference to FIG. 7.

Circuit 270 may be configured to convey electrical energy from one or more thermoelectric devices to one or more components of the propulsion system. For example, as shown in FIG. 2, circuit 270 may be operatively coupled to energy storage device 140 and/or an external energy supply 260, among other portions of the electrical system. A thermal control module 250 which may be included as part of controller 280 or separately as illustrated in FIG. 2 may be used to control where the electrical energy received from one or more of the thermoelectric devices by circuit 270 is used. For example, in addition to the energy storage device and external energy supply, the thermal control module may be used to facilitate the transfer of electrical energy between the thermoelectric devices and one or more of the induction device 120, energy storage device 140, motor 150, or accessories 170.

An exhaust passage 242 may be included with the engine system for facilitating the transport and/or aftertreatment of exhaust gases produced by the engine as indicated by 228. For example, a three-way catalyst, NOx trap, or other suitable exhaust aftertreatment device may be arranged along the exhaust passage as shown at 258. An exhaust gas sensor 272 may be included to provide a signal to controller 280 based on the concentration of particular constituents or products in the exhaust gases. As one example, sensor 272 may include an air/fuel ratio sensor or oxygen sensor. As another example, sensor 272 may include a NOx sensor. Further, exhaust passage 242 may include one or more thermoelectric devices in addition to or as an alternative to the thermoelectric devices described above with reference to the engine. Similarly, the thermoelectric device 130 for the exhaust passage may include a circuit 270 for facilitating the transfer of electrical energy to the thermal control module 250 and energy storage device 140 or motor, among other devices described herein. In some embodiments, the exhaust passage or a portion thereof may include one or more thermoelectric devices surrounded by a cooling sleeve 264. As described above with reference to cooling sleeve 244, a heat transfer media may be used to transfer heat from the exhaust passage. For example, the heat transfer media of cooling sleeve 264 may be used in common with the cooling sleeve 244 or may alternatively be separate cooling systems and/or fluids. A temperature sensor 268 may be included to provide an indication of temperature of the heat transfer media and/or thermoelectric devices to controller 280. In this manner, temperature gradients between the exhaust gases passing through the exhaust passage and the ambient air or cooling sleeve can be used to generate electrical energy via one or more thermoelectric devices.

The heat transfer media may pass through cooling sleeve 244 as indicated by 256 where it may be cooled by a heat exchanger such as a radiator 262. A pump or fan 255 may be included to facilitate the transfer of a fluid heat transfer media such as an engine coolant, water, or air among others. Pump 255 may be controlled by controller 280 via thermal control module 250. By varying the amount of pumping provided by pump 255, the flow rate of the heat transfer media may be adjusted, thereby controlling the heat transfer from the engine or exhaust system and the temperature at the thermoelectric devices. Radiator 262 may include a fan 252 that is controlled by the thermal control module 250. The flow rate of air provided to the radiator by the fan may be varied by control module 250 in response to operating conditions. In this manner, the amount of heat exchanged by the radiator with the surrounding ambient air may be adjusted. Radiator 262 may include one or more thermoelectric devices 130 as an alternative to or in addition to those described above with reference to the engine and exhaust passage. The thermoelectric devices for the radiator may also include a circuit 270 for facilitating transfer of electrical energy to the energy storage device or other devices described herein. In this manner, temperature gradients between the heat transfer media passing through the radiator and the ambient air can be used to generate electrical energy via one or more thermoelectric devices.

Thus, thermoelectric devices may be applied at various locations of the engine system and/or propulsion system to provide electrical energy generation where a temperature gradient exists. In some embodiments, the type of thermoelectric devices applied at the engine may be different than those at the exhaust passage and/or radiator. For example, thermoelectric devices having different temperature operating ranges may be applied at different locations where suitable.

In some cases, temperature sensing may be used to provide an indication of the temperature at the thermoelectric devices such as via sensors 268 and 234. Alternatively, the temperature at the thermoelectric device may be inferred from a level of electrical energy generate by the device. By monitoring the temperature, appropriate measures may be taken by the control system to limit the temperatures at the thermoelectric devices to reduce thermal damage that may be caused if the device reaches a temperature greater than a threshold temperature. As one example approach, the flow rate of the heat transfer media may be increased (e.g. via pump 255) to decrease the temperature at the thermoelectric device. In addition or as an alternative, the speed of fan 252 may be increased to provide greater heat transfer from the engine system, thereby reducing the temperature at the thermoelectric device. As yet another approach, operation of the engine may be adjusted to reduce the temperature of the engine and/or exhaust products that issuing from the engine. For example, the spark timing, valve timing, fuel injection amount and/or timing may be adjusted to vary the temperature of the engine. In this manner, the propulsion system may be controlled to reduce the potential for damage to the thermoelectric devices during operation.

FIGS. 3-6 are flow charts illustrating example control operations for the hybrid propulsion system described above with reference to FIGS. 1 and 2.

Figure 3:
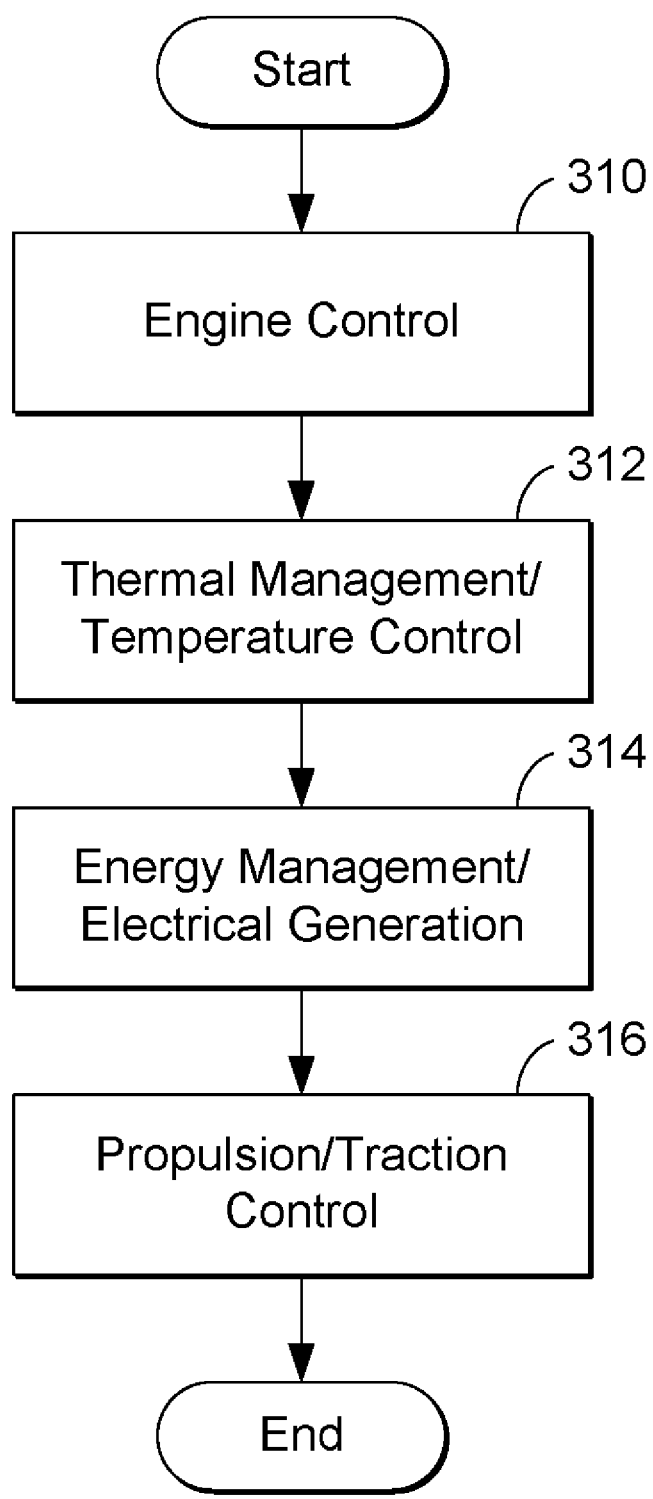

Referring to FIG. 3, a high level control diagram is illustrated describing some of the control strategies that will be described in greater detail with reference to FIGS. 4-6. For example, at 310, the control system may provide engine control by adjusting one or more of the spark timing, fuel injection timing, fuel injection amount, valve timing, engine temperature, engine load (e.g. via the amount of induction), engine speed, throttle position, intake air heating, etc. In some conditions, the engine may be shut-off or some of the cylinders may be deactivated in response to operating conditions of the propulsion system such as the amount of electrical energy requested, the amount of energy stored by the energy storage device, and/or the amount of electrical energy generated by the thermoelectric devices.

In some conditions, the combustion mode of the engine may be varied, such as between a spark ignition and a compression ignition mode or between a lean or rich air/fuel mode, among others. In this manner, the engine output may be controlled to provide the desired level of work to the induction system while maintaining a suitable temperature gradient for the thermoelectric devices.

At 312, the control system may provide thermal management or temperature control to some portions of the propulsion system, for example, to protect at least the thermoelectric devices from a temperature condition that may cause damage or reduce life-cycle. Further, the temperature at the thermoelectric devices can be controlled to achieve a target temperature range suitable for efficient conversion of the thermal gradient to electrical energy. The above objects may be achieved by adjusting the amount of heat produced by the engine (e.g. via 310) and/or the heat transfer rate via an adjustment of the heat transfer media. For example, a condition of the heat transfer media (e.g. coolant, air, water, etc.) such as the flow rate may be adjusted by increasing or decreasing the applied pump work or fan work, etc. By increasing the flow rate of the cooling fluid, the heat transfer rate may be increased, thereby potentially decreasing the temperature at the thermoelectric devices.

At 314, the control system may provide energy management and/or electrical generation control to maintain a suitable level of electrical energy production based on a level of electrical storage and/or electrical usage of the propulsion system. For example, the control system may manage the electrical energy generation by varying one or more of the engine output and/or temperature, a level of induction provided by the induction system, a state of charge (SOC) operating range for the energy storage device, the consumption of the various electrical systems such as the motor 150 and accessories 170.

At 316, the control system may provide propulsion and/or traction control of the components of the various propulsion system in response to driver demand. For example, the control system may match a torque request from the driver by supplying a suitable level of electrical energy to the motor. Alternatively, the control system may provide a suitable level of regenerative braking for the vehicle by converting kinetic energy at the wheels into electrical energy via the motor.

The various aspects of control shown in FIG. 3 may relate to each other such that an adjustment in the level of requested torque by the driver, for example, may be cause an adjustment of one or more of the engine control 310, temperature control 312, energy management 314, and propulsion/traction control 316. FIGS. 4-6 seek to illustrate how these control aspects may be interrelated for the hybrid propulsion system described herein.

Figure 4:
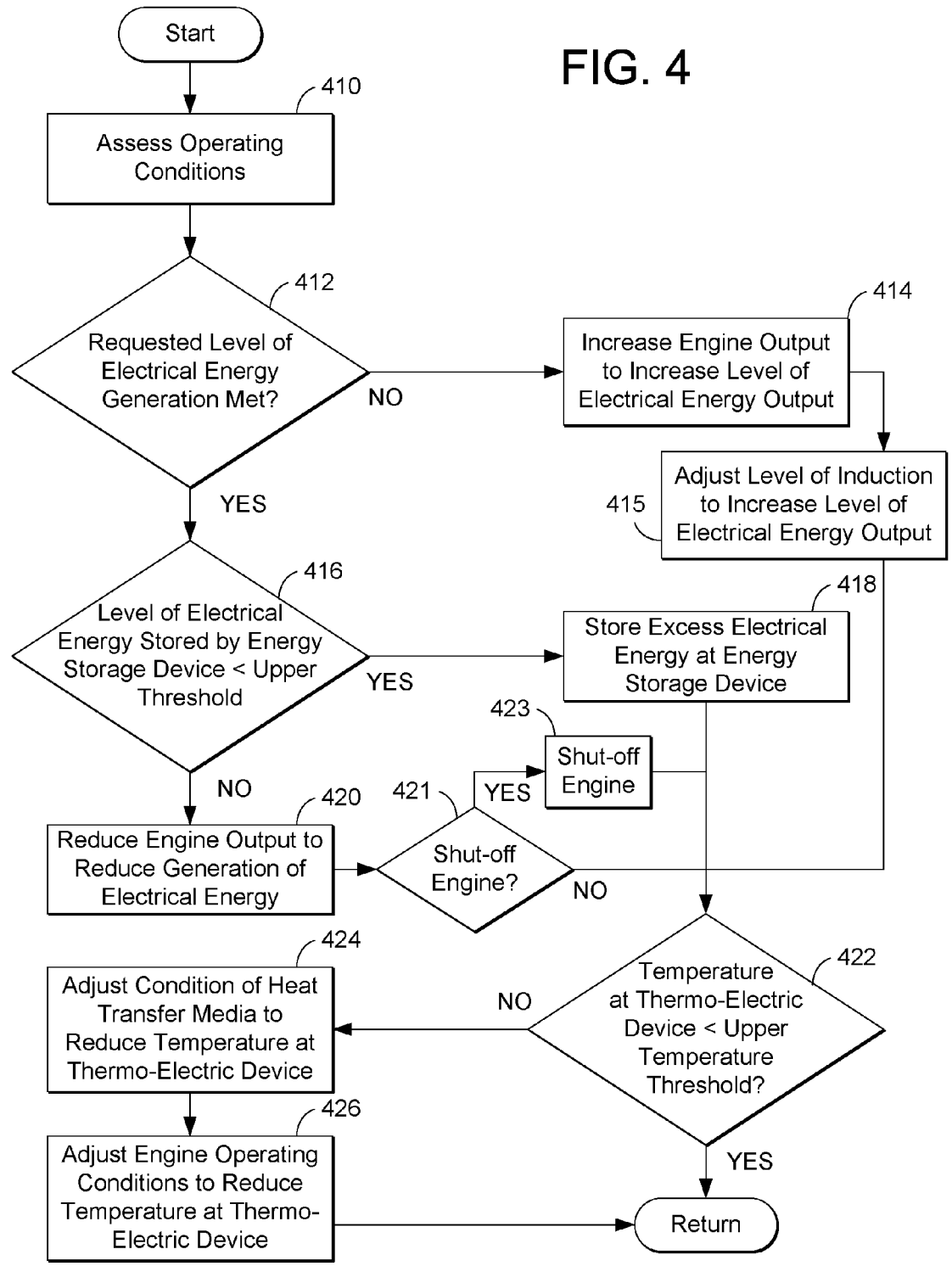
FIGS. 4-6 illustrate example routines for controlling the hybrid propulsion system.

Referring specifically to FIG. 4, a routine is described for controlling engine 110 in response to energy storage device condition (e.g. SOC) and temperature conditions at the thermoelectric device. At 410, the operating conditions of the propulsion system may be assessed including one or more of the engine temperature, ambient temperature, coolant temperature, ambient pressure, engine output, energy storage device state of charge, energy storage device temperature, ignition timing, fuel injection amount, fuel injection timing, valve timing, thermoelectric device temperature and output, requested wheel torque, speed, and level of induction, among other operating conditions.

At 412 it may be judged whether the requested level of electrical energy generation of the engine is met. For example, the control system may determine whether the current engine output is producing a suitable level of electrical energy via the induction device to propel the vehicle, while also considering additional sources of electrical energy such as the energy storage device and/or one or more thermoelectric devices as well as devices that may use a portion of the generated electrical energy such as one or more accessory devices. If the answer is no, the engine output may be increased at 414 to provide the requested level of electrical energy. At 415, the level of induction provided by the induction device may be adjusted to increase the amount of electrical energy generated. Alternatively, if the answer at 412 is yes, then it may be judged at 416 whether the level of electrical energy stored by the energy storage device is less than an upper energy storage threshold. If the answer at 416 is yes, at 418, the excess electrical energy may be stored at the energy storage device. Alternatively, if the answer at 416 is no, the engine output may be reduced to reduce the generation of electrical energy via the induction device at 420. Further, the level of induction provided by the induction device may be adjusted to reduce the amount of electrical energy generated in addition to or as an alternative to the reduction of engine output.

At 421, it may be judged whether to shut-off the engine or at least a cylinder thereof. If the answer is yes, the engine or a cylinder thereof may be shut-off at 423. For example, the engine may be shut-off when the level of energy stored by the energy storage device is at an upper threshold and the thermoelectric devices are providing sufficient electrical energy generation to support the requested torque at the wheels. An engine shut-off or cylinder deactivation operation may include the stopping of fuel delivery, spark and/or air exchange via valve operation. Alternatively, if the answer is no, the routine may proceed to 422.

From one or 414, 418, 423 or 421, it may be judged at 424 whether the temperature at one or more thermoelectric devices is less than an upper temperature threshold. For example, it may be determined based on a temperature of the hot side of the thermoelectric device is above, at, or approaching a threshold temperature for the particular device. In some embodiments, the temperature at the thermoelectric device may be determined or estimated based on a temperature sensor at the device, at the engine, between the engine and the thermoelectric device, and/or in an exhaust passage (in the case of an exhaust thermoelectric device) or radiator. As yet another example, the temperature of the thermoelectric device may be estimated based on an amount of electrical energy produced by the device in response to operating conditions of the device such as the current engine output and/or the temperature and/or flow rate of the cooling fluid on the cool side of the device, among others. Thus, it should be appreciated that the temperature at the thermoelectric devices may be inferred from various operating conditions.

If the answer at 422 is judged yes, the routine may return. Alternatively, if the answer at 422 is no, one or more operating conditions may be adjusted to reduce the temperature at the thermoelectric device, such as reducing heat generated by the engine at 426 and/or varying a condition of the cooling fluid supplied to the cool side of the thermoelectric device at 424. As one example, the amount of heat produced by the engine may be reduced by varying the spark timing, fuel injection amount, fuel injection timing, valve timing, engine load via the level of induction of the induction device, etc. For example, a level of induction may be adjusted to reduce engine load, thereby reducing engine temperature. Further, the temperature of the thermoelectric devices may be reduced by increase the heat transfer from the engine, engine exhaust, or engine coolant by varying a flow rate of the heat transfer media. For example, to reduce engine temperature, the flow rate of an engine coolant may be increased and/or the fan speed at the radiator may be increased, etc. Finally, the routine may return.

In this manner, a suitable level of energy may be generated by operation of the engine via the induction device while also maintaining a suitable temperature at the thermoelectric devices. By adjusting the engine and/or load applied to the engine via the induction device, the level of electrical generation may be controlled. As will be described in greater detail with reference to FIG. 5, the level of electrical generation may also be controlled by adjusting the temperature gradient across the thermoelectric devices as alternative to or in addition to the operation of FIG. 4.

Figure 5:
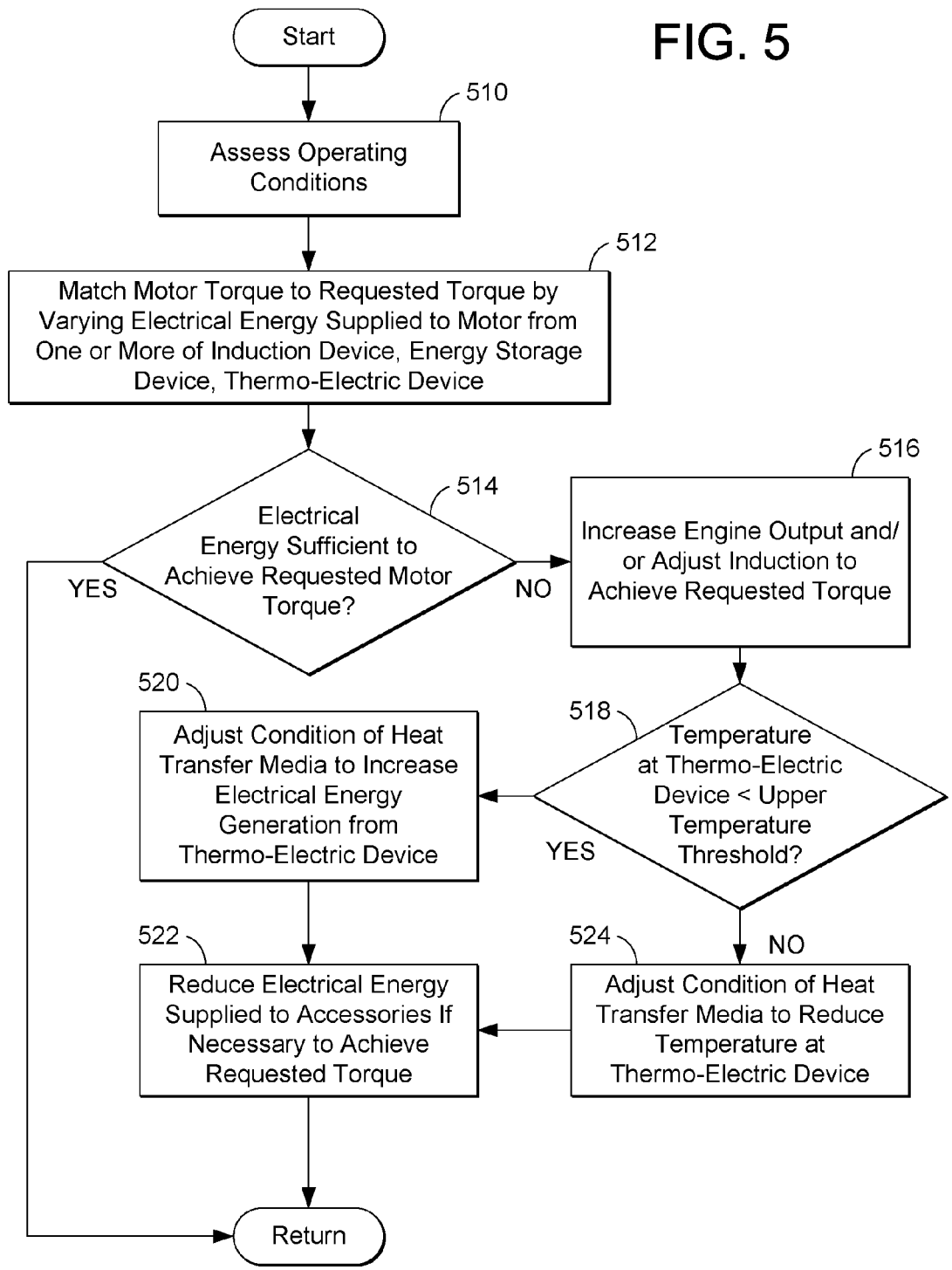

Referring now to FIG. 5, a routine is described for controlling the propulsion system so that the desired level of torque is delivered to the drive wheels while maintaining the thermoelectric devices below an upper temperature threshold. At 510, the operating conditions may be assessed, for example, as described above with reference to 410. At 512, the actual torque produced by the motor may be matched to the torque requested by the driver by supplying a suitable level electrical energy to the motor from one or more of the induction device (e.g. via engine output), energy storage device, and one or more thermoelectric devices.

At 514, it may be judged whether the electrical energy supplied to the motor is sufficient to achieve the requested motor torque. If the answer is no, the engine output may be increased to produce a suitable level of electrical energy via the induction machine to enable the motor to achieve the requested torque. Further, at 516, the level of induction provided by the induction device may be adjusted to vary the amount of electrical energy generated. Alternatively, if the answer at 514 is yes, the routine may return.

At 518 it may be judged whether the temperature at each of thermoelectric devices is less than an upper temperature threshold of the device, for example, as described above with reference to 424.

If the answer at 518 is yes, then the heat transfer media may be adjusted at 520 to increase the electrical energy generated from the thermoelectric devices. For example, the temperature gradient may be increased by increasing the flow rate of the coolant and/or increasing the engine temperature. Alternatively, if the answer at 518 is no, then the heat transfer media may be adjusted at 524 to decrease the temperature at the thermoelectric device having a temperature at or greater than the temperature threshold. In this manner, the requested torque produced by the propulsion system may be achieved while also protecting the thermoelectric devices from thermal damage. From 520 or 524, the amount of electrical energy supplied to one or more accessories may be reduced if necessary at 522 to reduce the total electrical consumption of the propulsion system in order to achieve the requested torque at the drive wheels. Next, the routine may return to 512, where a suitable amount of electrical energy may be supplied to the motor to achieve the requested wheel torque. Once the electrical energy is deemed sufficient to achieve the requested motor torque, the routine may end or may return to 410.

Figure 6:
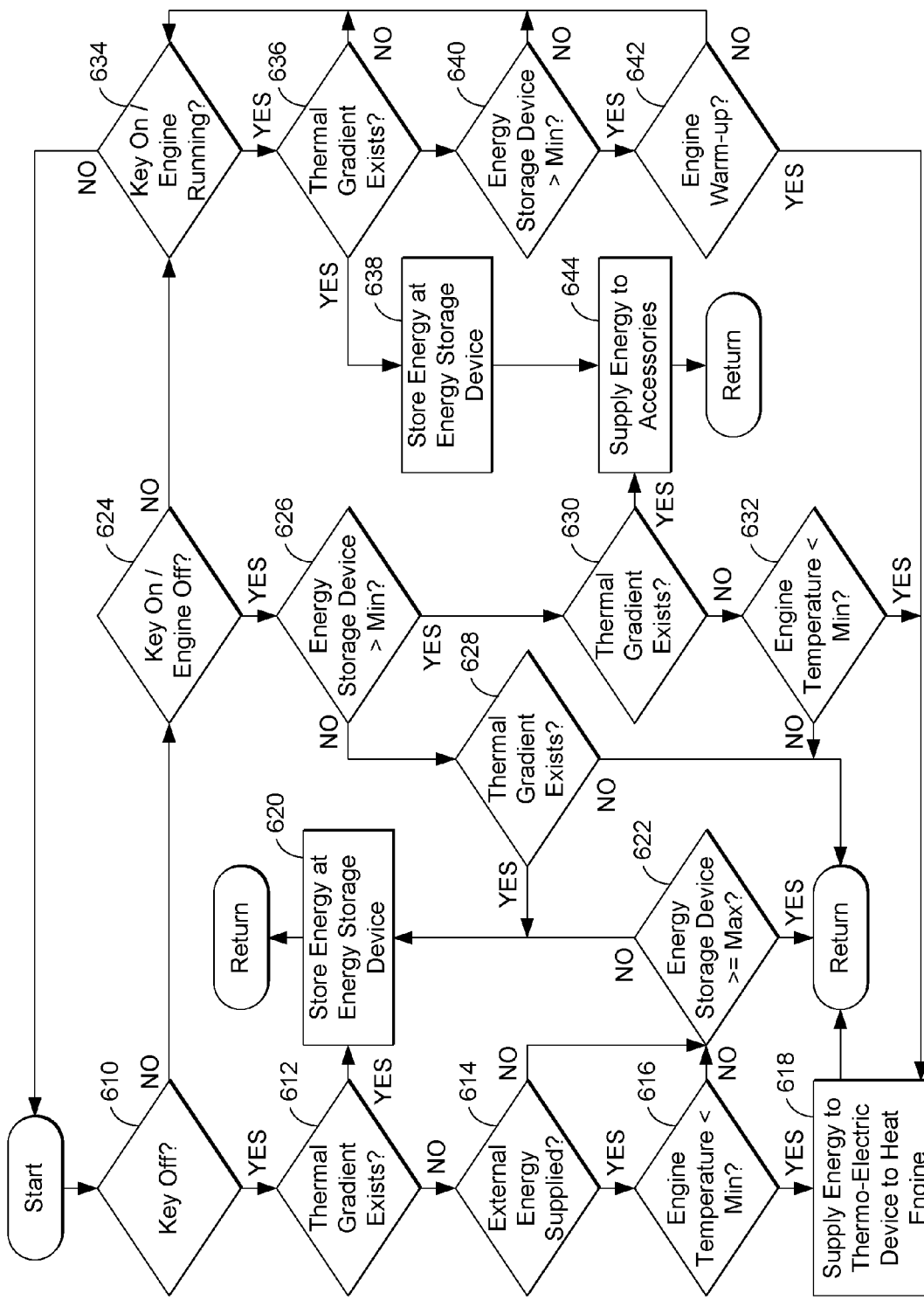

Referring now to FIG. 6, a routine for controlling the propulsion system during different operating modes is illustrated. The routine may begin by judging at 610 whether the ignition key is in the off position (e.g. the propulsion system is turned off). If the answer is no, it may be judged at 624 whether key is on and the engine is turned off. For example, propulsion may be provided by the motor via energy stored in the energy storage device and/or energy generated by one or more thermoelectric devices while the engine is shut-down. If the answer at 624 is no, it may be judged at 634 whether the key is on and the engine is running. If the answer at 634 is no, the routine may return. In this way, the routine may judge whether the propulsion system is operating in one of a propulsion system off mode, propulsion system on/engine off mode, or propulsion system on/engine on mode.

Alternatively, if it is judged at 610 that the key is off, it may be judged next at 612 whether a thermal gradient exists. For example, the control system may judge whether a temperature difference exists across one or more of the thermoelectric devices. This may be inferred, for example, by detecting and comparing the temperature of the engine, the exhaust gases, the heat transfer media, and/or ambient conditions. As another example, the control system may detect whether the thermoelectric devices are generating electrical energy and/or the amount of electrical energy they are generating, which can be correlated to the thermal gradient. If the answer at 612 is yes, the electrical energy generated by the thermoelectric devices may be stored at the energy storage device at 620, wherein the routine may return.

Alternatively, if the answer at 612 is no, it may be judged at 614 whether the propulsion system is receiving energy from an external source such as external energy supply 180. If the answer at 614 is yes, it may be judged whether the engine temperature is greater than a lower temperature threshold. For example, the control system may identify the engine temperature by measuring the temperature of one or more of the heat transfer media, ambient temperature, temperature in the exhaust passage, catalyst temperature, and/or may detect a level of electrical energy generated by the thermoelectric devices, which may be correlated to engine temperature. As one example, the lower temperature threshold of the engine may be a temperature where pre-heating is to be used to facilitate starting of the engine.

If the answer at 616 is yes, the control system may supply energy to one or more thermoelectric devices to heat the engine at 618. For example, the control system may be configured to selectively apply electrical energy to some of the thermoelectric devices, such as those in the vicinity of the engine. Next, the routine may return. Alternatively, if the answer at 614 or 616 is no, then it may be judged at 622 whether the energy storage device has a level of energy storage (e.g. SOC) that is at or above an upper storage threshold. The upper storage threshold may be selected to protect the energy storage device from being overfilled or oversaturated, thereby protecting it from potential damage. If the answer at 622 is yes, the routine may return. Alternatively, if the level of energy stored by the energy storage device is less than the threshold, then the electrical energy generated by the thermoelectric devices may be stored at 620.

Returning to 624, if it is alternatively judged that the key is on and the engine is off, it may be judged at 626 whether the energy storage device is greater than a lower energy storage threshold. For example, the control system may select a energy storage level where charging should be initiated. If the answer at 626 is no, it may be judged at 628 whether a thermal gradient exists, for example, as described with reference to 612. If the answer is yes, then the energy generated by the thermoelectric devices may be stored at the energy storage device at 620. Alternatively, if the answer at 628 is no, the routine may return.

Returning to 626, if it is alternatively judged that the level of energy stored at the energy storage device is greater than the lower threshold, it may be judged at 630 whether a thermal gradient exists, for example, as described with reference to 612. If the answer is no, it may be judged at 632 whether the engine temperature is less than a lower threshold, for example, as described with reference to 616. If the answer at 632 is yes, then electrical energy may be supplied to one or more of the thermoelectric devices at 618 to heat the engine. Alternatively, if the answer at 632 is no, then the routine may return.

If it is judged at 630 that a thermal gradient exists, energy produced by the thermoelectric devices may be made available for use by the accessories at 644. For example, a car sound system, air-conditioning, power windows, etc. may be operated from energy produced at least partially by the thermoelectric devices. Next, the routine may return.

Returning to 634, if it is judged that the key is on and the engine is running, it may be judged at 636 whether a thermal gradient exists, for example, as described with reference to 612. If the answer is no, the routine may return to 634. Alternatively if the answer is yes, the control system may store at least a portion of the energy produced by the thermoelectric devices at 638 and/or may supply energy to one or more accessories at 644. Further, it may be judged at 640 whether the energy storage device includes a level of stored energy that is greater than a lower threshold. The lower threshold at 640 may be the same or different (e.g. higher or lower) than the threshold described at 626. If the answer at 640 is no, the routine may return to 634. Alternatively, if the answer at 640 is yes, it may be judged at 642 whether the engine is in a warm-up condition (e.g. the engine temperature is less than a temperature threshold). If the answer is no, the routine may return to 634. Alternatively, if the answer at 642 is yes, energy may be supplied to one or more thermoelectric device to provide engine heating.

Further, in some embodiments, some of the thermoelectric devices may be used to provide catalyst heating during warm-up and/or before start-up of the engine. For example, the control system may detect the temperature of the catalyst and provide catalyst heating via nearby thermoelectric devices before start-up of the engine to improve aftertreatment of the exhaust gases produced by the engine.

In this manner, the routine illustrated in FIG. 6 provides a control strategy that may be employed to utilize the energy generated from thermal gradients of the propulsion system in different ways depending on operating conditions such as the SOC of the energy storage device, the temperature of the engine and/or catalyst, and the running mode of the engine, among others.

Figure 7A:
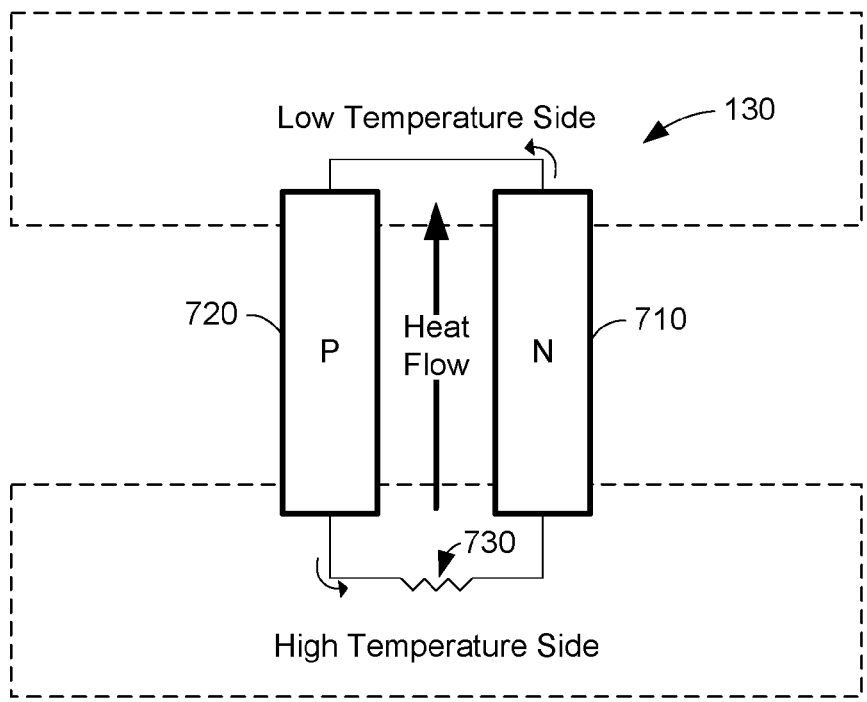
FIGS. 7A and 7B illustrate a detailed view of example thermoelectric devices.
Figure 7B:
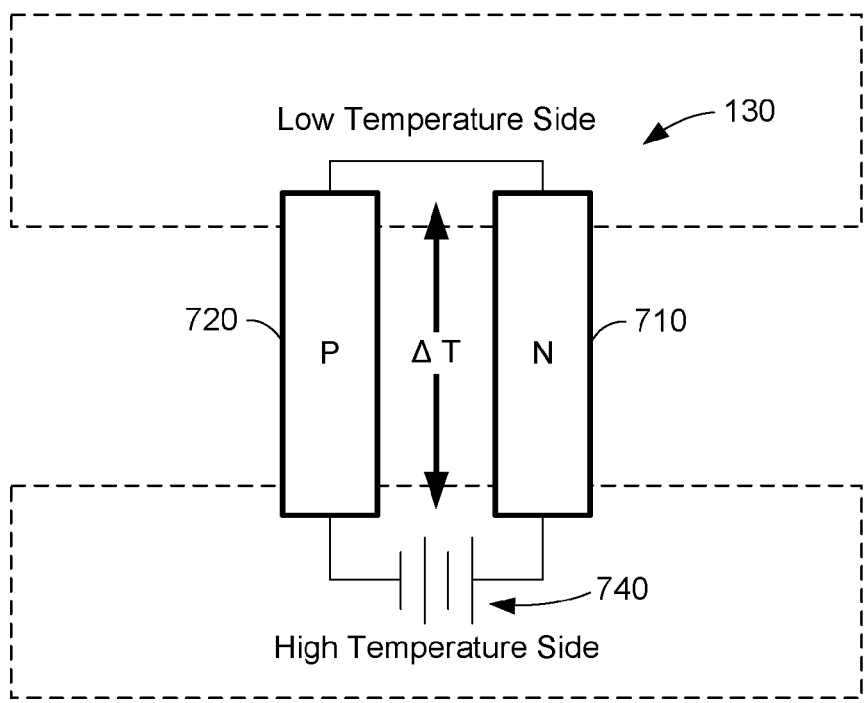

FIGS. 7A and 7B illustrate a detailed view of an example thermoelectric device 130 including at least one pair of P-type 720 and N-type 710 semiconductors. While thermoelectric device 130 is shown including only one pair of semiconductors, in practice a thermoelectric device may include an array of tens, hundreds, or thousands or more of these semi-conductor pairs. A first end of the P-type and N-type pair is shown in thermal communication with a high temperature side of the device and a second opposite end of the pair is shown in thermal communication with a low temperature side of the device.

As shown in FIG. 7A, heat is shown flowing from the high temperature side (e.g. the engine, exhaust passage, or radiator) to the low temperature side (e.g. the heat transfer media or ambient air) as may occur between the engine, exhaust passage, radiator, or other component and a cooling media. The temperature gradient applied to the device causes current to flow through the circuit where it may be used by an electrical load 730. In this way, the thermoelectric device may utilize the Seebeck effect to generate electrical energy. Load 730 may be any suitable electrical load including one or more of the motor, energy storage device, another thermoelectric device, induction device or accessory.

Further, the p-type and n-type semiconductors may include any suitable material for enabling the conversion of electrical energy to a thermal gradient or visa-versa. As one example, these semiconductors may include PbTe, SiGe, or Bi2Te3, or other material suitable for operation at the temperature range for the particular application.

FIG. 7B illustrates a semiconductor pair as shown in FIG. 7A alternatively including a DC current source 730. A temperature difference may be formed between the opposite sides of the semiconductor pair in response to the level of current provided to the circuit as indicated by the high temperature side and low temperature side of the device. It should be appreciated that the high temperature and low temperature sides may be reversed by reversing the direction of the current flow.

The p-type and n-type semiconductors shown in FIG. 7B may be the same or different from the those shown in FIG. 7A. In some embodiments, the thermoelectric circuit may be configured to selectively provide a load as indicated in FIG. 7A or a DC current source as indicated in FIG. 7B based on the desired level of heating, cooling, or electrical generation desired. In this manner, a thermoelectric conversion system including one or more groups of the semiconductor pairs may be controlled to perform various heating, cooling, or electrical generation functions in response to signals provided by the control system. For example, the amount of heating or cooling provided by the thermoelectric device may be controlled by proportionately varying a level and/or direction of current provided to the circuit, while the amount of electrical energy generated may be controlled by the applied load and/or the temperature gradient involved.

Note that the example control and estimation routines included herein can be used with various engine and/or vehicle system configurations. The specific routines described herein may represent one or more of any number of processing strategies such as event-driven, interrupt-driven, multi-tasking, multi-threading, and the like. As such, various acts, operations, or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated acts or functions may be repeatedly performed depending on the particular strategy being used. Further, the described acts may graphically represent code to be programmed into the computer readable storage medium in the engine control system.

It will be appreciated that the configurations and routines disclosed herein are exemplary in nature, and that these specific embodiments are not to be considered in a limiting sense, because numerous variations are possible. For example, the above technology can be applied to V-6, I-4, I-6, V-12, opposed 4, and other engine types. The subject matter of the present disclosure includes all novel and nonobvious combinations and subcombinations of the various systems and configurations, and other features, functions, and/or properties disclosed herein.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A hybrid propulsion system for a vehicle, comprising:
a fuel burning engine for producing at least some heat;
a thermoelectric device for generating electrical energy from a thermal gradient caused by the heat produced by the engine;
an energy storage device for storing electrical energy;
an electric motor for at least partially propelling the vehicle in response to an amount of electrical energy supplied to the motor; and
a control system for varying an amount of heat produced by the engine in response to a temperature of the thermoelectric device.

2. The propulsion system of claim 1, wherein the amount of heat produced by the engine is varied by adjusting at least one of an amount of fuel supplied to the engine, a timing of fuel delivery, a spark timing, a valve timing, and a flow rate of an engine coolant.

3. The system of claim 2, wherein the amount of heat produced by the engine is varied to limit the temperature of the thermoelectric device to less than a threshold temperature; and wherein the amount of heat produced by the engine is varied during operation of the engine by adjusting at least one of the amount of fuel supplied to the engine, the timing of fuel delivery, the spark timing, and the valve timing.

4. The propulsion system of claim 1, wherein the condition of the engine includes an operating state of the engine and the condition of the thermoelectric device includes an amount of electrical energy generated by the thermoelectric device, wherein the control system causes the engine to shut-off when a first amount of electrical energy is generated by the thermoelectric device and the control system causes the engine to operate when a second amount less than said first amount of electrical energy is generated by the thermoelectric device.

5. The propulsion system of claim 1, wherein the engine is a free-piston engine and the propulsion system further comprises an induction machine for converting movement of a free-piston of the engine to electrical energy; and wherein the control system is configured to further vary a condition of the engine in response to a level of electrical energy stored by the energy storage device.

6. A propulsion system for a vehicle, comprising:
an internal combustion engine;
a thermoelectric device in thermal communication with the engine; and
a control system configured to:
during a first mode, supply electrical energy to the thermoelectric device from at least an energy supply external the vehicle to cause the thermoelectric device to produce at least some heat; and
during a second mode, operate the engine to produce at least some heat, where the thermoelectric device is operated to convert a temperature gradient at the thermoelectric device to electrical energy and wherein the control system is further configured to adjust an operating condition of the engine in response to a thermoelectric device temperature of the thermoelectric device.

7. The propulsion system of claim 6, wherein during the first mode, at least a portion of the heat produced by the thermoelectric device is used to heat the internal combustion engine.

8. The propulsion system of claim 7, wherein said thermoelectric device is arranged between said engine and a cooling sleeve of said engine, wherein said cooling sleeve includes a heat transferring fluid.

9. The propulsion system of claim 7, wherein the first mode is performed when the engine is at a lower temperature and the second mode is performed when the engine is at a higher temperature.

10. The propulsion system of claim 9, wherein the first mode is performed during at least one of before start-up of the engine and during warm-up of the engine, and wherein the second mode is performed during at least one of after warm-up of the engine and after shut-off of the engine.

11. The propulsion system of claim 9, wherein the higher temperature is greater than ambient air temperature.

12. The propulsion system of claim 6, wherein said thermoelectric device is arranged along an exhaust passage downstream of said engine, where during the first mode, at least a portion of the heat produced by the thermoelectric device is used to heat the exhaust passage.

13. The propulsion system of claim 12, wherein said thermoelectric device is in thermal communication with a catalyst of the exhaust system of the engine, where during the first mode, at least a portion of the heat produced by the thermoelectric device is used to heat the catalyst, wherein the first mode is performed at least during a warm-up of the engine.

14. The propulsion system of claim 6, further comprising an energy storage device, wherein during the second mode, at least a portion of the electrical energy converted by the thermoelectric device is stored by the energy storage device.

15. The propulsion system of claim 6, wherein during the first mode, at least a portion of said electrical energy is supplied to the thermoelectric device from an energy storage device.

16. The propulsion system of claim 6, further comprising an electric motor for propelling the vehicle, wherein during the second mode, at least a portion of the electrical energy from the conversion performed by thermoelectric device is used to operate the motor.

17. The propulsion system of claim 1, wherein the operating condition of the engine includes at least one of an amount of fuel supplied to the cylinder, a fuel injection timing, a spark timing, a valve timing, and a flow rate of an engine coolant.

18. The propulsion system of claim 6, wherein said thermoelectric device is coupled to at least one of a radiator or a cooling passage of the engine.

19. The propulsion system of claim 6, wherein the engine is a free-piston engine and includes an induction device for converting motion of at least one free-piston of the engine to electrical energy.

20. The system of claim 6, further comprising an energy storage device; and wherein the control system is further configured to, during the first mode, supply electrical energy to the energy storage device from the energy supply external the vehicle to recharge the energy storage device.

21. A hybrid propulsion system for a vehicle, comprising:
a free-piston engine having at least one moveable piston, said engine producing heat;
an induction machine for converting movement of the piston to electrical energy;
a thermoelectric device arranged between a combustion chamber of the engine and a cooling sleeve of the engine for generating electrical energy from a thermal gradient between the combustion chamber and the cooling sleeve caused by heat produced by operation of the engine;
an energy storage device for storing electrical energy;
an electric motor for propelling the vehicle in response to an amount of electrical energy supplied to the motor; and
a control system for varying a condition of the engine in response to an amount of electrical energy generated by the thermoelectric device and a thermoelectric device temperature.

* * * * *